(12) United States Patent
Geller

(10) Patent No.: US 10,674,815 B1
(45) Date of Patent: Jun. 9, 2020

(54) DEVICE STAND

(71) Applicant: R3 COLLABORATIVES, INC., San Francisco, CA (US)

(72) Inventor: Adam Joseph Geller, San Francisco, CA (US)

(73) Assignee: R3 COLLABORATIVES, INC., San Francisco, CA (US)

(*) Notice: Subject to any disclaimer, the term of this patent is extended or adjusted under 35 U.S.C. 154(b) by 0 days.

(21) Appl. No.: 16/181,802

(22) Filed: Nov. 6, 2018

(51) Int. Cl.
A47B 23/04 (2006.01)
H05K 5/02 (2006.01)
G09F 23/00 (2006.01)
F16M 11/38 (2006.01)

(52) U.S. Cl.
CPC ......... A47B 23/044 (2013.01); H05K 5/0234 (2013.01); F16M 11/38 (2013.01); G09F 23/00 (2013.01)

(58) Field of Classification Search
CPC ........... F16M 13/00; F16M 11/38; A47F 5/12; A47B 23/043; A47B 23/044; H05K 5/0234
See application file for complete search history.

(56) References Cited

U.S. PATENT DOCUMENTS

| 2,550,857 | A | * | 5/1951 | Overbaugh | G09F 1/14 248/459 |
| 3,285,399 | A | * | 11/1966 | Snow | A47F 5/112 229/108 |
| 4,372,086 | A | * | 2/1983 | Hanlon | A47F 5/112 160/135 |
| 5,335,753 | A | * | 8/1994 | Campbell | B25H 1/06 182/151 |
| 5,388,798 | A | * | 2/1995 | Glick | A47G 1/142 248/453 |
| 6,352,233 | B1 | * | 3/2002 | Barberich | A47B 21/0314 248/456 |
| 6,819,548 | B2 | * | 11/2004 | Hillis | A47B 23/042 361/679.44 |

(Continued)

FOREIGN PATENT DOCUMENTS

JP 2015128505 A 7/2015
KR 20170069670 A 6/2017

Primary Examiner — Eret C McNichols
(74) Attorney, Agent, or Firm — Hickman Palermo Becker Bingham LLP

(57) ABSTRACT

In an embodiment, a device stand, comprises an elongated rectangular sheet defined by a top edge, a bottom edge, a first side edge and a second side edge; three (3) fold lines extending laterally across the sheet and spaced apart along the sheet, a first fold line from among the three fold lines being at a midpoint of a length of the sheet; a first device slot extending laterally in the sheet from the top edge and positioned apart from the first fold line; a second device slot extending laterally in the sheet from the top edge and positioned apart from the first fold line, symmetrically opposite the first fold line from the first device slot; a first interlocking slot extending upwardly from the bottom edge and positioned between the first side edge and a second fold line among the three fold lines; a second interlocking slot extending downwardly from the top edge and positioned between the second side edge and a third fold line among the three fold lines.

15 Claims, 3 Drawing Sheets

(56) References Cited

U.S. PATENT DOCUMENTS

| | | | |
|---|---|---|---|
| 7,417,853 B1* | 8/2008 | Myers | F16M 11/38 |
| | | | 248/917 |
| 7,798,530 B1* | 9/2010 | Mercado | A47B 23/044 |
| | | | 248/459 |
| 9,433,287 B2* | 9/2016 | Chen | A47B 23/044 |
| 9,832,298 B2* | 11/2017 | Date | F16M 11/041 |
| 9,942,998 B1* | 4/2018 | Mayes | H04M 1/04 |
| 2004/0188588 A1* | 9/2004 | Smith | A47B 23/044 |
| | | | 248/459 |
| 2009/0179124 A1* | 7/2009 | Caplan | A47B 23/044 |
| | | | 248/176.1 |
| 2009/0321605 A1* | 12/2009 | Petrie | F16M 13/00 |
| | | | 248/452 |
| 2012/0006951 A1* | 1/2012 | Lin | A47B 23/044 |
| | | | 248/188.6 |
| 2013/0026329 A1* | 1/2013 | Lane | A47B 23/043 |
| | | | 248/459 |
| 2013/0240704 A1* | 9/2013 | Andrews | A47B 23/043 |
| | | | 248/454 |
| 2016/0338487 A1* | 11/2016 | McGrane | A47B 23/04 |
| 2019/0059576 A1* | 2/2019 | Culver | A47B 23/044 |
| 2019/0281976 A1* | 9/2019 | Taylor | A47B 21/04 |

* cited by examiner

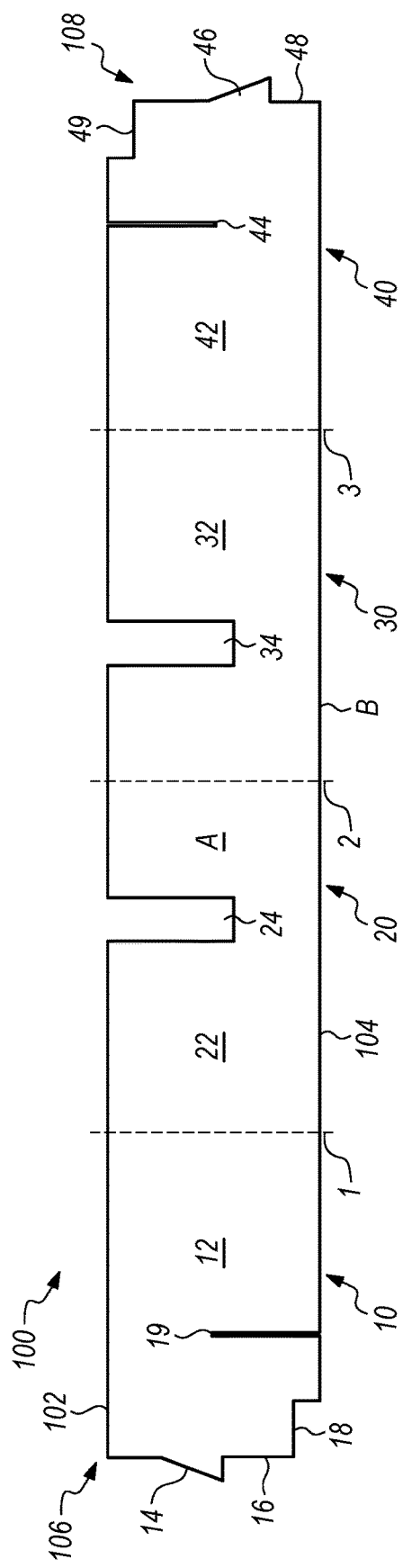
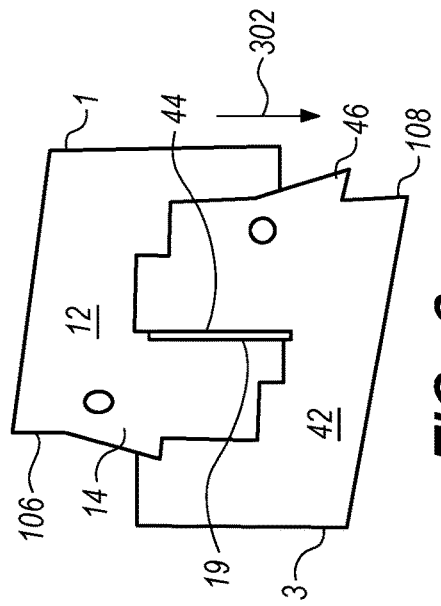
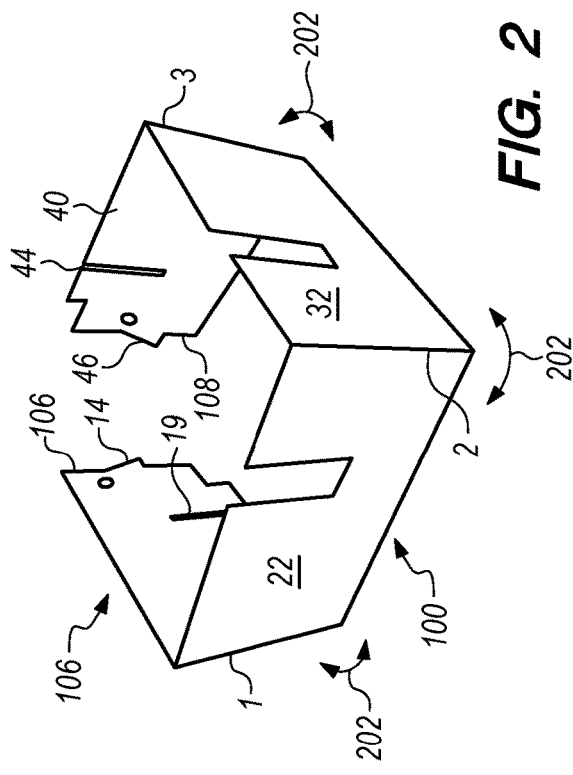
FIG. 1
FIG. 2
FIG. 3

DEVICE STAND

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright or rights whatsoever. © 2018 R3 Collaboratives.

FIELD OF THE DISCLOSURE

One technical field of the disclosure is stands for devices such as portable electronics. Another technical field is structures formed of folded sheet material.

BACKGROUND

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section. Further, it should not be assumed that any of the approaches described in this section are well-understood, routine, or conventional merely by virtue of their inclusion in this section.

Digital cameras, mobile phones, tablet computers and other electronic devices are now widely used for digital imaging and photography. A common problem in this field is stabilizing the device to obtain a high-quality image. Past approaches have included miniature tripods formed of plastic or metal, unipods having an elongated leg that rests on a ground surface, or the use of image stabilization software. All these approaches have the disadvantages of mechanical complexity, difficulty of use, or high cost.

Simpler holders for these devices have been proposed. Examples include U.S. Pat. Nos. 9,832,298; 9,022,341; Japan patent publication 2015128505A, and Korean patent publication 20170069670A. These references propose curved structures, layers and laminations, angled or spring mechanisms that are not ideal for photographic use. What is needed is a stand that is simple and low-cost to produce yet achieves stable support in a manner that promotes good-quality photos.

SUMMARY

The appended claims may serve as a summary of the invention.

BRIEF DESCRIPTION OF THE DRAWINGS

In the drawings:

FIG. 1 is a top plan view of one side of a device stand in unfolded planar format, in one embodiment.

FIG. 2 is a perspective view of the device stand of FIG. 1 in a partly folded configuration.

FIG. 3 is a perspective view of ends of the device stand of FIG. 1, FIG. 2 in partly interlocked position.

DETAILED DESCRIPTION

Figure 5:
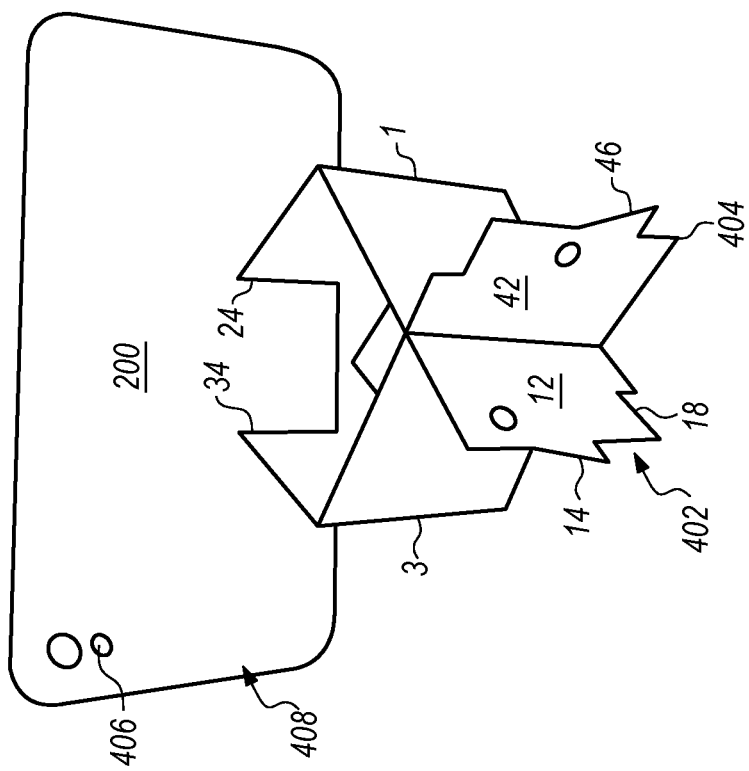
FIG. 5 is a second perspective view of the device stand of FIG. 1, FIG. 2, FIG. 3 in fully folded and interlocked position, and shown holding an example device, viewed from a second side that is opposite to FIG. 4.

In the following description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

General Overview

In an embodiment, a device stand comprises an elongated rectangular sheet defined by a top edge, a bottom edge, a first side edge and a second side edge; three (3) fold lines extending laterally across the sheet and spaced apart along the sheet, a first fold line from among the three fold lines being at a midpoint of a length of the sheet; a first device slot extending laterally in the sheet from the top edge and positioned apart from the first fold line; a second device slot extending laterally in the sheet from the top edge and positioned apart from the first fold line, symmetrically opposite the first fold line from the first device slot; a first interlocking slot extending upwardly from the bottom edge and positioned between the first side edge and a second fold line among the three fold lines; a second interlocking slot extending downwardly from the top edge and positioned between the second side edge and a third fold line among the three fold lines.

In another embodiment, a device stand comprises an elongated rectangular sheet defined by a top edge, a bottom edge, a first side edge, a second side edge and three (3) fold lines extending laterally across the sheet and spaced apart along the sheet, a first fold line from among the three fold lines being at a midpoint of a length of the sheet; a first device slot extending laterally in the sheet from the top edge and positioned apart from the first fold line; a second device slot extending laterally in the sheet from the top edge and positioned apart from the first fold line, symmetrically opposite the first fold line from the first device slot; a first interlocking slot extending upwardly from the bottom edge and positioned between the first side edge and a second fold line among the three fold lines; a second interlocking slot extending downwardly from the top edge and positioned between the second side edge and a third fold line among the three fold lines; the sheet being folded inwardly on the three fold lines and having the first interlocking slot interlocked with the second interlocking slot to form a quadrilateral in which the first device slot and second device slot are aligned near an acute angle formed at the second fold line.

In any such embodiment, the first device slot and the second device slot each may have a longitudinal width that is equal to a thickness of a portable electronic device or may have a longitudinal width that is equal to a thickness of a smartphone. The three fold lines comprise any of scored lines or perforated lines. Embodiments may further comprise a half triangular protuberance extending longitudinally outwardly from the first side edge, or may comprise a first half triangular protuberance extending longitudinally outwardly from the first side edge and a second half triangular protuberance extending longitudinally outwardly from the second side edge.

In a further embodiment, a stand for a mobile computing device comprises an elongated rectangular sheet defined by a top edge, a bottom edge, a first side edge, a second side edge and three (3) fold lines extending laterally across the sheet and spaced apart along the sheet, a first fold line from among the three fold lines being at a midpoint of a length of the sheet; a first device slot extending laterally in the sheet from the top edge and positioned apart from the first fold line, and a second device slot extending laterally in the sheet from the top edge and positioned apart from the first fold line, symmetrically opposite the first fold line from the first device slot, the first device slot and the second device slot each having a longitudinal width that is equal to a thickness of the mobile computing device; a first interlocking slot extending upwardly from the bottom edge and positioned between the first side edge and a second fold line among the three fold lines; a second interlocking slot extending downwardly from the top edge and positioned between the second side edge and a third fold line among the three fold lines; the sheet being folded inwardly on the three fold lines and having the first interlocking slot interlocked with the second interlocking slot to form a quadrilateral in which the first device slot and second device slot are aligned near an acute angle formed at the second fold line.

Example Embodiments

FIG. 1 is a top plan view of one side of a device stand in unfolded planar format, in one embodiment.

In an embodiment, a device stand comprises an elongated planar sheet 100 defined by a top edge 102, bottom edge 104, left side edge 106 and right side edge 108 and having a first face A and a second face B. In various embodiments, sheet 100 is formed of paper, cardstock, sheet plastic such as polystyrene or polypropylene, a metal such as aluminum, brass or copper, or any other relatively rigid sheet material. Sheet 100 may have a thickness in the range 0.005" to 0.125" in some embodiments and the use of different materials may permit the use of different thicknesses of sheet material.

In an embodiment, sheet 100 is formed as a single unitary sheet having a plurality of slots, recesses or cuts. While a unitary structure is used, for purposes of explaining a clear example, sheet 100 may be conceptualized as having four (4) regions 10, 20, 30, 40 defined by fold lines 1, 2, 3. Regions 10, 20, 30, 40 are defined solely for orienting the reader of this disclosure to locate elements of sheet 100 and do not represent independent structural elements of embodiments. The fold lines 1, 2, 3 indicate locations of folds of the sheet 100 that may be imposed to cause forming the sheet into a stand. Fold lines 1, 2, 3 may be marked, scored or perforated to indicate a location of folding and/or to facilitate folding in straight lines. Fold line 2 may be located at a mathematical center of an overall length of the sheet 100.

In an embodiment, region 10 comprises a planar face 12 and is defined by fold line 1 and edge 106. Region 10 comprises an upwardly oriented slot 19 or cut that is perpendicular to edge 104 and extends about halfway across a width of the region. Slot 19 has a width greater than a thickness of sheet 100 yet narrow enough to snugly engage a corresponding slot 44 of region 40, as further described herein. Edge 106 may feature an outwardly extending protuberance 14 formed as a half triangle. Face 12 may further feature a longitudinally inwardly extending recess 18. In some embodiments, a form of protuberance 14 and recess 18, in combination with printed indicia on face 12, may represent a stylized human face in which the protuberance represents a nose and recess represents a chin. Other embodiments may omit protuberance 14 and recess 18, which are optional; edge 106 may be entirely straight and perpendicular to edges 102, 104 so that region 10 is rectangular.

In an embodiment, region 20 comprises a planar face 22 and is generally rectangular but comprises a laterally downwardly extending generally rectangular recess 24. In an embodiment, recess 24 has a width that is sufficiently wide to permit a device to rest partly in the recess when the sheet 100 is assembled as a stand, as further described for other views. In an embodiment, recess 24 is formed closer to fold line 2 than to fold line 1, but this dimensioning may vary in different embodiments depending on a length or size of a device to be held using the stand.

In an embodiment, region 30 comprises a planar face 32 and is generally rectangular but comprises a laterally downwardly extending generally rectangular recess 34. In an embodiment, recess 34 has a width that is sufficiently wide to permit a device to rest partly in the recess when the sheet 100 is assembled as a stand, as further described for other views. Recess 34 may have the same width as recess 24 of region 20. In an embodiment, recess 34 is formed closer to fold line 2 than to fold line 3, but this dimensioning may vary in different embodiments depending on a length or size of a device to be held using the stand. The locations of recesses 24, 34 may be symmetrical with respect to fold line 2.

In another embodiment, recesses 24, 34 are not fully cut out in the form of a slot and, instead, are cut only on the bottom edge and one of the laterally oriented sides. As a result, a tab-like structure is formed which acts as a spring. This approach can help keep upright devices which are smaller than the device slot.

In an embodiment, region 40 comprises a planar face 42 and is defined by fold line 3 and edge 108. Region 40 comprises a downwardly oriented slot 44 or cut that is perpendicular to edge 104 and extends about halfway across a width of the region. Slot 19 has a width greater than a thickness of sheet 100 yet narrow enough to snugly engage corresponding slot 19 of region 10, as further described herein. Edge 108 may feature an outwardly extending protuberance 46 formed as a half triangle. Face 12 may further feature a laterally upwardly extending recess 48. In some embodiments, a form of protuberance 46 and recess 48, in combination with printed indicia on face 42, may represent a stylized human face in which the protuberance represents a nose and recess represents a chin. Other embodiments may omit protuberance 46 and recess 48, which are optional; in some embodiments, edge 108 may be entirely straight and perpendicular to edges 102, 104 so that region 10 is rectangular.

Dimensions of sheet 100 are not critical. In one embodiment, sheet 100 is approximately 33 cm long and 5 cm wide and is formed of 0.07 cm sheet cardstock. Recesses 24, 34 may be 0.5 cm wide in one embodiment and slots 19, 44 may be 0.08 cm wide. Face A and/or Face B may be printed with color, graphics, text or indicia, including brands, advertising or other information.

Each of slots 19, 24, 34, 44 may be formed via die cutting, slitting, punching or other means of cutting.

FIG. 2 is a perspective view of the device stand of FIG. 1 in a partly folded configuration. In an embodiment, a device stand may be formed using sheet 100 by folding inwardly, in the same direction, along each of lines 1, 2, 3, 4 as indicated by arrows 202. Folding in this manner results in arranging sheet 100 in a generally open polygonal arrangement as seen in FIG. 2. An open rectangle may be formed in this manner in which faces 22, 32 are continuous but regions 10, 40 do not fully meet to form a closed rectangular shape. Instead, edges 106, 108 are moved close to one another, and edge 106 is lifted upward over edge 108 to interlock slot 19 in or with slot 44.

FIG. 3 is a perspective view of ends of the device stand of FIG. 1, FIG. 2 in partly interlocked position. In this view slots 19, 44 have been joined part way such that protuberance 14 is higher in position than protuberance 46. Edge 106 or protuberance 14 may be urged downward as indicated by arrow 302 to snugly interlock slot 19 in slot 44. When slots 19, 44 are dimensioned approximately the same as a thickness of the sheet 100, interlocking the slots in the foregoing manner in combination with frictional forces developed by the sheet material will cause the slots and ends of the sheet to remain snugly in place.

Figure 4:
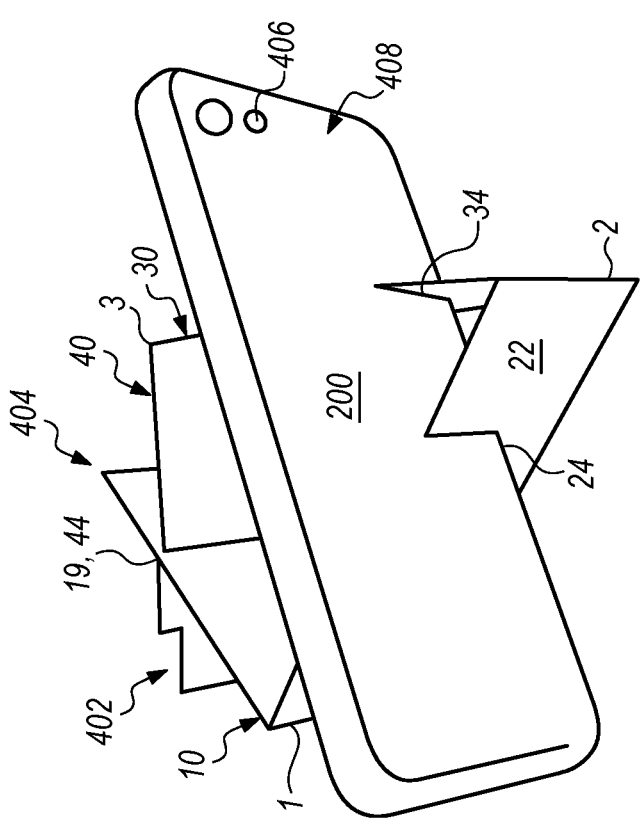
FIG. 4 is a first perspective view of the device stand of FIG. 1, FIG. 2, FIG. 3 in fully folded and interlocked position, and shown holding an example device, viewed from a first side.

When relatively rigid material is used for sheet 100, the rectangular folded arrangement of the sheet and interlocking of slots 19, 44 forms a rigid stand that is capable of holding a device in slots 24, 34. FIG. 4 is a first perspective view of the device stand of FIG. 1, FIG. 2, FIG. 3 in fully folded and interlocked position, and shown holding an example device, viewed from a first side. FIG. 5 is a second perspective view of the device stand of FIG. 1, FIG. 2, FIG. 3 in fully folded and interlocked position, and shown holding an example device, viewed from a second side that is opposite to FIG. 4. Referring first to FIG. 4, it will be seen that interlocking of slots 19, 44 causes sheet 100 to assume the form of a geometric kite when viewed from the top, and having outwardly extending wings 402, 404 that terminate in protuberances 14, 46, as best seen in FIG. 5. In this manner the sheet is folded inwardly on the three fold lines and has the first interlocking slot interlocked with the second interlocking slot to form a quadrilateral in which the first device slot and second device slot are aligned near an acute angle formed at the second fold line.

In an embodiment, in a completed stand as shown in FIG. 4, FIG. 5, a device 200 may be placed in slots 24, 34 and will be held in a vertical position or slightly canted position depending on a relationship of a width or thickness of the device to the width or thickness of the slots.

When the device 200 is a mobile phone or smartphone, the width or thickness of slots 24, 34 may be arranged to closely match a thickness or width of the device to hold the device in a generally vertical position with respect to a surface on which the stand rests. Furthermore, in the arrangement of FIG. 4, FIG. 5, a device 200 having a camera aperture 406 near one end 408 of the device 200 is unobstructed by the stand. Touch-screen buttons of a graphical user interface (not shown) of the device 200 also are unobstructed and accessible for tapping or other manual gestures. These benefits are achieved by folding line 2 at a relatively acute angle and at a center point of the sheet 100 to form the aforementioned kite-shaped parallelogram formation of the stand. Therefore, a stand of this arrangement may be used as a stable platform for imaging without interference with a camera aperture or touchscreen of the device 200.

Figure 6:
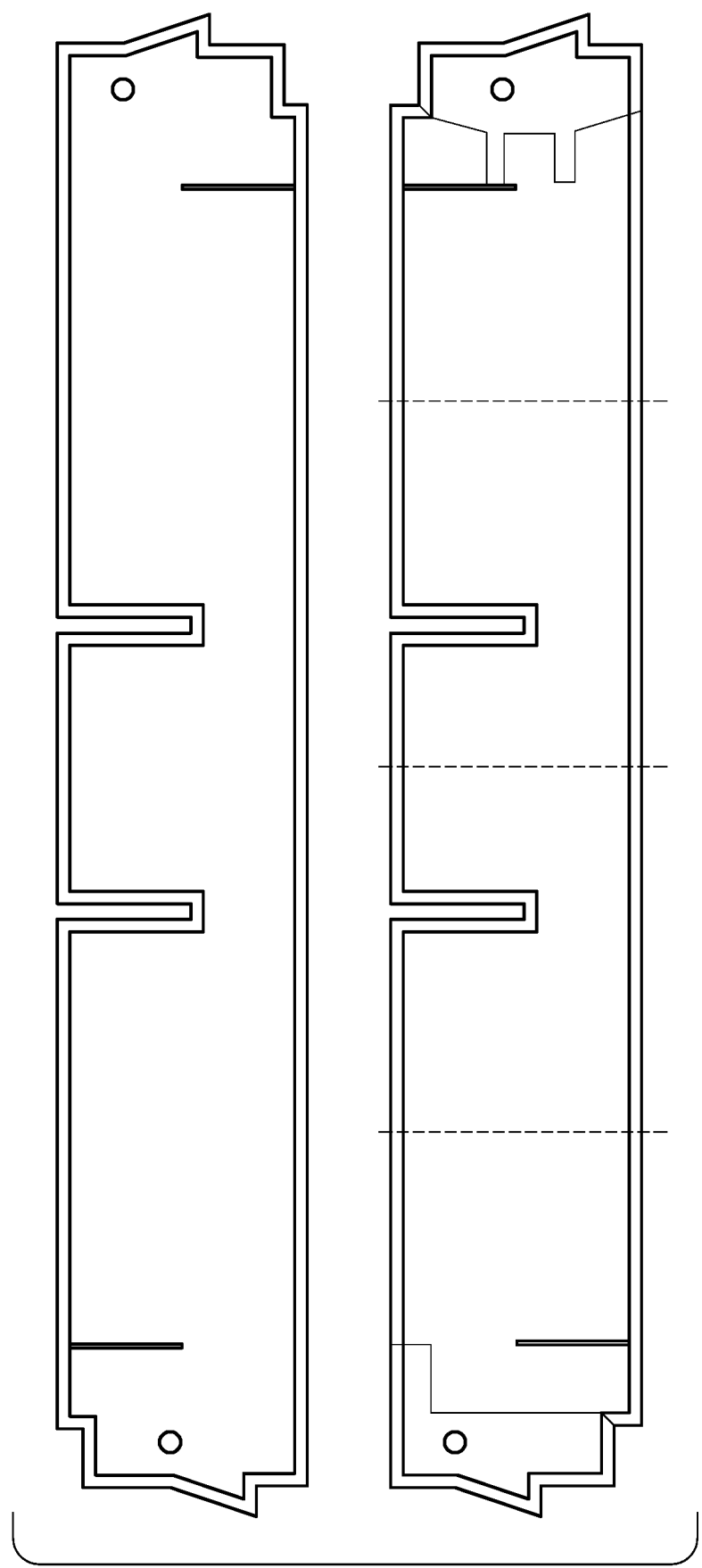
FIG. 6 is a two-part diagram showing a device stand in an unfolded planar format, illustrating two sides, with specific dimension and shading information to indicate color and indicia that can be used in one embodiment.

FIG. 6 is a two-part diagram showing a device stand in an unfolded planar format, illustrating two sides, with specific dimension and shading information to indicate color and indicia that can be used in one embodiment. The specific dimensions, colors, text and indicia indicated in FIG. 6 represent one working example, but are not required in all embodiments.

Embodiments have the benefit that the placement of slots can be repositioned along the face to accommodate larger devices like tablets without impacting the overall stability. Thus, a wider holder can be formed for a larger tablet device without increasing the size of the overall sheet. Furthermore, depending on the materials chosen, the entire stand can be full folded into a compact and flat item that can be stored easily for transport. In some embodiments, the resulting item would fit inside a wallet or other small carrier and would be approximately the size of a business card.

In one embodiment, tabs 106 and 108 could be optionally modified by the user of the device such that they are glued down or otherwise affixed to create a more fixed or permanent stand.

Another benefit of the designs disclosed herein is that they balance weight of devices toward the center fold. This creates multiple points for stability on the surface. For example, the folded sheet could be positioned on an uneven surface, and the stand will still make at least three points of contact, resulting in stable support.

Yet another benefit of embodiments is that they may utilize relatively lightweight materials to successfully implement stands for devices. For example, cardstock paper can achieve a holding capacity and stability that prior disclosures have required metals and plastics to achieve.

In the foregoing specification, embodiments of the invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction.

What is claimed is:

1. A device stand, comprising:
   an elongated generally rectangular sheet defined by a top edge, a bottom edge, a first side edge and a second side edge;
   three (3) fold lines extending laterally across the sheet and spaced apart along the sheet, a first fold line from among the three fold lines being at a midpoint of a length of the sheet;
   a first device slot extending laterally in the sheet from the top edge and positioned apart from the first fold line;
   a second device slot extending laterally in the sheet from the top edge and positioned apart from the first fold line, symmetrically opposite the first fold line from the first device slot;
   a first interlocking slot extending upwardly from the bottom edge and positioned between the first side edge and a second fold line among the three fold lines;
   a second interlocking slot extending downwardly from the top edge and positioned between the second side edge and a third fold line among the three fold lines; and
   a half triangular protuberance extending longitudinally outwardly from the first side edge.

2. The device stand of claim 1 wherein the first device slot and the second device slot each have a longitudinal width that is equal to a thickness of a portable electronic device.

3. The device stand of claim 1 wherein the first device slot and the second device slot each have a longitudinal width that is equal to a thickness of a smartphone.

4. The device stand of claim 1 wherein the three fold lines comprise any of scored lines or perforated lines.

5. The device stand of claim 1, further comprising a first half triangular protuberance extending longitudinally outwardly from the first side edge and a second half triangular protuberance extending longitudinally outwardly from the second side edge.

6. The device stand of claim 1, further comprising a first half triangular protuberance extending longitudinally outwardly from the first side edge and a second half triangular protuberance extending longitudinally outwardly from the second side edge.

7. The device stand of claim 1, wherein the elongated sheet is formed of any of paper, cardstock, polystyrene, polypropylene, aluminum, brass or copper.

8. A device stand, comprising:
   an elongated generally rectangular sheet defined by a top edge, a bottom edge, a first side edge, a second side edge and three (3) fold lines extending laterally across the sheet and spaced apart along the sheet, a first fold line from among the three fold lines being at a midpoint of a length of the sheet;
   a first device slot extending laterally in the sheet from the top edge and positioned apart from the first fold line;
   a second device slot extending laterally in the sheet from the top edge and positioned apart from the first fold line, symmetrically opposite the first fold line from the first device slot;
   a first interlocking slot extending upwardly from the bottom edge and positioned between the first side edge and a second fold line among the three fold lines;
   a second interlocking slot extending downwardly from the top edge and positioned between the second side edge and a third fold line among the three fold lines;
   the sheet being folded inwardly on the three fold lines and having the first interlocking slot interlocked with the second interlocking slot to form a quadrilateral in which the first device slot and second device slot are aligned near an acute angle formed at the second fold line; and
   a half triangular protuberance extending longitudinally outwardly from the first side edge.

9. The device stand of claim 8 wherein the first device slot and the second device slot each have a longitudinal width that is equal to a thickness of a portable electronic device.

10. The device stand of claim 8 wherein the first device slot and the second device slot each have a longitudinal width that is equal to a thickness of a smartphone.

11. The device stand of claim 8 wherein the three fold lines comprise any of scored lines or perforated lines.

12. The device stand of claim 8, wherein the elongated sheet is formed of any of paper, cardstock, polystyrene, polypropylene, aluminum, brass or copper.

13. A stand for a mobile computing device, the stand comprising:
   an elongated generally rectangular sheet defined by a top edge, a bottom edge, a first side edge, a second side edge and three (3) fold lines extending laterally across the sheet and spaced apart along the sheet, a first fold line from among the three fold lines being at a midpoint of a length of the sheet, the fold lines comprising any of scored lines or perforated lines;
   a first device slot extending laterally in the sheet from the top edge and positioned apart from the first fold line, and a second device slot extending laterally in the sheet from the top edge and positioned apart from the first fold line, symmetrically opposite the first fold line from the first device slot, the first device slot and the second device slot each having a longitudinal width that is equal to a thickness of the mobile computing device;
   a first interlocking slot extending upwardly from the bottom edge and positioned between the first side edge and a second fold line among the three fold lines;
   a second interlocking slot extending downwardly from the top edge and positioned between the second side edge and a third fold line among the three fold lines;
   the sheet being folded inwardly on the three fold lines and having the first interlocking slot interlocked with the second interlocking slot to form a quadrilateral in which the first device slot and second device slot are aligned near an acute angle formed at the second fold line; and
   a first half triangular protuberance extending longitudinally outwardly from the first side edge and a second half triangular protuberance extending longitudinally outwardly from the second side edge.

14. The stand of claim 13 wherein the first device slot and the second device slot each have a longitudinal width that is equal to a thickness of a smartphone.

15. The stand of claim 13, wherein the elongated sheet is formed of any of paper, cardstock, polystyrene, polypropylene, aluminum, brass or copper.

* * * * *